(12) United States Patent
Meissner

(10) Patent No.: US 9,343,611 B2
(45) Date of Patent: May 17, 2016

(54) METHOD FOR PRODUCING INTERCONNECTED OPTOELECTRONIC COMPONENTS, AND INTERCONNECTED OPTOELECTRONIC COMPONENTS

(71) Applicant: crystalsol GmbH, Vienna (AT)

(72) Inventor: Dieter Meissner, Buchen (DE)

(73) Assignee: crystalsol GmbH, Vienna (AT)

( * ) Notice: Subject to any disclaimer, the term of this patent is extended or adjusted under 35 U.S.C. 154(b) by 24 days.

(21) Appl. No.: 14/402,801

(22) PCT Filed: Mar. 26, 2013

(86) PCT No.: PCT/EP2013/056348
§ 371 (c)(1),
(2) Date: Nov. 21, 2014

(87) PCT Pub. No.: WO2013/174548
PCT Pub. Date: Nov. 28, 2013

(65) Prior Publication Data
US 2015/0108509 A1   Apr. 23, 2015

(30) Foreign Application Priority Data

May 22, 2012 (DE) .......................... 10 2012 208 552

(51) Int. Cl.
*H01L 21/00* (2006.01)
*H01L 31/18* (2006.01)
(Continued)

(52) U.S. Cl.
CPC ............ *H01L 31/188* (2013.01); *H01L 27/153* (2013.01); *H01L 31/0384* (2013.01);
(Continued)

(58) Field of Classification Search
CPC .................. H01L 2924/00014; H01L 31/048; H01L 31/18; H01L 2924/00; H01L 31/0481; H01L 31/0749; H01L 2224/05644; H01L 2924/00012; H01L 51/4253; H01L 2224/05144; H01L 2224/05155; H01L 2224/05166
USPC .................... 257/288, 829, E31.11, E33.056, 257/E31.127; 438/26, 64–66
See application file for complete search history.

(56) References Cited

U.S. PATENT DOCUMENTS

| 5,674,325 A | 10/1997 | Albright et al. | |
|---|---|---|---|
| 2011/0155217 A1* | 6/2011 | Yang et al. | ..................... 136/246 |
| 2012/0067423 A1* | 3/2012 | Lochtefeld et al. | ........... 136/261 |

FOREIGN PATENT DOCUMENTS

| EP | 1 521 309 A1 | 4/2005 |
|---|---|---|
| WO | 2005/029657 A1 | 3/2005 |

(Continued)

OTHER PUBLICATIONS

International Search Report and Written Opinion for corresponding patent application No. PCT/EP2013/056348 dated May 8, 2014.

*Primary Examiner* — Kimberly Rizkallah
*Assistant Examiner* — Maria Ligai
(74) *Attorney, Agent, or Firm* — Renner, Otto, Boisselle & Sklar, LLP

(57) ABSTRACT

The invention relates to a method for producing serially interconnected optoelectronic components as well as optoelectronic components interconnected according to the method. In a first step, an electrically non-conductive layer with optoelectronic material introduced therein and at least one first wire or thread (2) located in the layer is produced. The first wire or thread either is electrically conductive from the outset or can subsequently be treated in such a way that it becomes electrically conductive as a result of the treatment. A first and second electrooptically active region of the layer is electrically connected to the first wire or thread in such a way that they are electrically interconnected to each other in series. By the wire, regions of the layer are subdivided in a simple manner, as a result of which a plurality of optoelectronic components are produced in a technically simple manner. Continuous production is possible.

16 Claims, 1 Drawing Sheet

Figure 1:
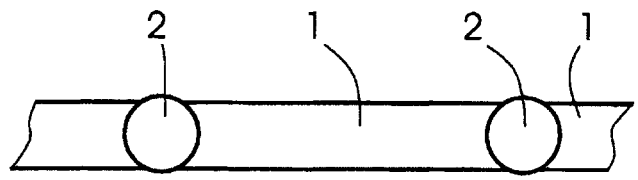

(51) Int. Cl.
  *H01L 31/0384* (2006.01)
  *H01L 31/046* (2014.01)
  *H01L 31/0465* (2014.01)
  *H01L 31/054* (2014.01)
  *H01L 27/15* (2006.01)
  *H01L 31/05* (2014.01)
  *H01L 33/00* (2010.01)
  *H01L 33/62* (2010.01)

(52) U.S. Cl.
  CPC .......... *H01L31/046* (2014.12); *H01L 31/0465* (2014.12); *H01L 31/0504* (2013.01); *H01L 31/0547* (2014.12); *H01L 33/005* (2013.01); *H01L 33/62* (2013.01); *H01L 2924/0002* (2013.01); *H01L 2933/0066* (2013.01); *Y02E 10/52* (2013.01)

(56) References Cited

FOREIGN PATENT DOCUMENTS

WO 2007/085343 A1 8/2007
WO 2010/000581 A2 1/2010

\* cited by examiner

METHOD FOR PRODUCING INTERCONNECTED OPTOELECTRONIC COMPONENTS, AND INTERCONNECTED OPTOELECTRONIC COMPONENTS

The invention relates to a method for producing preferably serially interconnected optoelectronic components, as well as optoelectronic components. Optoelectronic components convert light into electrical current or vice versa. Examples for optoelectronic components are solar cells such as thin layer solar cells, photoelectric detectors or light emitting diodes.

Thin layer solar cells, for example on the basis of amorphous silicon, consist of a series of single layers, in particular a substrate as well as a rear contact layer coated thereon, an active layer, including optional buffer layers or other required layers, and a front contact layer. Following application of the respective layer, the single layers may be patterned, if necessary, for example by way of a laser, or may be patterned mechanically, to obtain subdivision into single layers.

From patent document WO 2007/085343 A1 a method for producing series-connected solar cells is known, wherein a substrate is applied to a bearing surface bent towards a depositing device, in the deposition chamber. The substrate is under mechanical prestressing or is bent in a manner corresponding to the bearing surface. Patterning a layer that is to be applied is done by way of tensioned wires resting against the substrate that has been applied to the bent bearing layer with a defined force, thus shading the material layers already applied, or the substrate. By way of shading a material layer is patterned, which subsequently is to be applied.

From patent document WO 2010/000581 A1 a method for producing a monograin membrane is known, wherein a layer of a binder is provided. Photoelectrically active grains are introduced through a surface of the layer into the layer. Subsequently, the binder is solidified. If the grains subsequently are electrically contacted at both sides of the layer, e.g. a solar cell is produced.

It is an object of the present invention to provide a method allowing technically simple production of optoelectronic components which are electrically interconnected to each other. Moreover it is an object of the invention to provide optoelectronic components which are electrically interconnected to each other, which may be fabricated in a simple manner.

To solve the object, a method comprises the features of claim 1.

In a first step, an electrically non-conductive layer with optoelectronic material introduced therein and at least one first wire or thread (2) located in the layer is produced. The first wire or thread either is electrically conductive from the outset or can subsequently be treated in such a way that it becomes electrically conductive as a result of the treatment. A first and second electrooptically active region of the layer is electrically connected to the first wire or thread in a way that they preferably are interconnected to each other. By the wire, regions of the layer are subdivided in a simple manner, as a result of which a plurality of optoelectronic components are produced in a technically simple manner. Continuous production is possible. Especially the method known from WO 2010/000581 A1 may be performed in an adapted form. Adaption is required only and unless something else is described in the following. Thus, the method known from WO 2010/000581 A1 will be developed further in a way that the electrically conductive material described therein, which is produced in a web or tube-shaped manner, is provided by the first wire or thread that is unwound from a roll in continuous production. If herein in the following it is not otherwise stated, the materials mentioned in WO 2010/000581 A1 are preferably used. The disclosure of WO 2010/000581 A1 is fully incorporated by reference in the present application.

Into the layer which for example is from 1 to 100 µm thick and which may be present as a membrane, in one embodiment, at least a first wire or thread is introduced through a layer surface, and in particular is introduced in such a way that it protrudes from the layer surface at least at one side, and preferably protrudes from both layer surfaces. In this way, the wire or thread especially is unwound from a roll, for ease of production. In one embodiment, a membrane is also unwound from a roll for continuous production.

If the wire or thread is introduced into the layer through a surface, such as being pushed in, a wire section protruding from said surface is subsequently not contaminated by the material of the layer and consequently may advantageously be contacted without any cleaning step.

The layer may consist of an optoelectronic material, i.e. a material, which is able to convert light to electric current or vice versa.

Preferably, in one embodiment, optoelectronic material is introduced into the electrically non-conductive layer or membrane, respectively, and is introduced especially in the manner, know from WO 2010/000581 A1, or else the membrane already contains optoelectronic material, before introduction of the first wire or thread into the layer or membrane, respectively. It is thus provided a layer or membrane, respectively, for example the monograin membrane known from the above-mentioned international patent application, allowing electrical contacting that reaches through the layer or membrane, respectively, of the introduced optoelectronic material, due to the first wire or thread.

The optoelectronic material, which is incorporated into the layer of electrically non-conductive material preferably is in the form of particles. In one embodiment of the invention, the particles are introduced from one side through the surface of the layer into the latter, and especially are only introduced partially, such that they protrude from the surface. Preferably, the particle diameter is larger than the thickness of the layer. In this embodiment, the particles are especially introduced in such a way that they protrude from both sides of the layer.

In one embodiment, the particle diameters are for example between 2 and 110 µm, such as for example between 63 and 75 µm. Advantageously, the particle size distribution is small. Preferably, the particle diameters only vary not more than 20 µm, preferably not more than 15 µm, so as to contact as many particles as possible. In this way, the particle material is at least essentially fully utilized.

By way of the first wire or thread an electrical conductor is provided in a technically simple manner, which is able to connect a rear contact of an optoelectronic component to the front contact of an adjacent optoelectronic component. Especially, the rear contact as well as the front contact are applied following introduction of the first wire and/or thread, such that they are connected to the first wire or thread in an electrically conductive manner. If it is a thread which initially is not yet electrically conductive, it is made electrically conductive, and generally is made electrically conductive before application of the rear contact and/or the front contact. If the wire or thread protrudes only at one side of the layer or membrane, respectively, from the surface, then the other side suitably is exposed, as required, for example by grinding, in order to be able to electrically contact the first wire or thread through the rear contact or front contact. The first wire may consist of metal. However, it is sufficient if the surface of the first wire or thread is coated with an electrically conductive material in such a way that an electrical conductor may be provided through the layer.

In one embodiment, the first wire is for contacting the optoelectronic components only at one side, preferably only from the rear side, to minimize for example disorders of light incidence or light emission on the front side. In this case, the optoelectronic components will have for example rear contacts which for example are electrically separated from each other, as well as front contacts which are electrically interconnected to each other. Moreover, there are one or more first wires separating the optoelectronic components from each other, which are electrically connected to the front contacts, but not to the rear contacts, enabling electrical contacting, from the rear side of the optoelectronic components, not only the rear contacts, but also the front contacts.

The layer may be on a substrate consisting of glass or may be on another layer. Advantageously, the layer as well as the substrate, if necessary, including other layers which are possibly present, is flexible, thus simplifying and accelerating production. In particular, continuous fabrication is enabled by providing or producing, respectively, the layer including the substrate and other layers as a web. In particular, it is a substrate which, for the sake of rapid production, advantageously is present as a continuous web that is for example unwound from a roll. The flexible substrate may for example consist of metal or a polymer and especially is present as a sheet.

In order to be able to introduce the first wire or thread into the layer, in one preferred embodiment, the material of the layer is a polymer which at least is not yet fully cured. The material of the polymer is liquid, viscous or at least plastic, when the first wire or thread is for example pushed into the polymer or sinks into the layer. It is not before completion of introduction into it that the material of the layer is fully cured. Preferably, curing of the material of the layer has already progressed before introducing the first wire or thread, such that the material is viscous to plastic. In this way it is achieved or is at least assisted, following introduction of the first wire or thread into the viscous or plastic material, respectively, that the wire is fixed to maintain its position.

The diameter of the first wire or thread is preferably larger than the thickness of the layer or membrane, respectively. This embodiment allows the wire to protrude at both sides of the layer or membrane, respectively, by way of introducing the first wire from one side into the membrane. The layer or membrane may for example be present on a plastic base layer, such as for example an adhesive layer. If the first wire or thread is for example pushed into the opposite surface of the layer or membrane, respectively, the first wire or thread then finally reaches the base layer and will protrude from both surfaces of the layer or membrane, and will protrude at least every time the first wire or thread has somewhat been pushed into the plastic base layer. If, at a later time, the base layer will be removed, such as for example rinsed off, the first wire or thread then may be contacted on both sides for serially connecting. Especially, in this embodiment, removal of material, such as for example grinding or etching that might be associated with damages, may be avoided. In this way a continuous electrical contact may be provided through the layer or membrane, respectively, in a technically most simple and gentle manner.

In an advantageous embodiment of the invention at least a first wire, preferably a plurality of first wires protrude from the front side in such a way that light entering toward the wire is deflected into at least one adjacent optoelectronically active layer. Effectivity will thereby be ameliorated. Preferably, the cross section of the wire or thread is such that the desired deflection becomes maximal. Triangular, pentangular or round or oval cross sections are suitable for deflection in the desired manner. Especially, in this embodiment, the wire or thread has a metallic and consequently well reflecting surface.

In a preferred embodiment of the invention, following introduction of the first wire or thread, particles consisting of an optoelectronic material are introduced into the layer from one side, and are for example pushed into it. It thus is achieved that introduction of the wire into the layer will not be hampered by particles which are already present in the layer. In this way, production faults will be avoided.

Preferably, the particles consisting for example of a semiconductor are introduced through a surface of the layer from which a first wire or thread protrudes. If the first wire or thread protrudes from the upper surface of the layer or membrane, respectively, the wire or thread advantageously directs optoelectronic particles into regions of the membrane, where optoelectronic particles may become effective. It will be avoided most reliably that the particles impair any subsequent electrical contacting of the first wire or the thread which, if necessary, is made conductive.

If a first wire has been introduced into the layer, in one embodiment, optoelectronic active regions of the layer may subsequently be serially connected to each other in a manner known from WO 2010/000581 A1. However, in another preferred embodiment of the invention, optoelectronic active regions may together form a continuous solar cell in the manner that is preferred for crystalline solar cells. In another application, the embedded contacts then allow diverting the front contact via the rear side, such as it is used in the so called "wrap-through" contactings.

In another preferred embodiment, adjacent electrodes are contacted through the embedded one or more first wires or threads adjacent to light emitting semiconductor layers or semiconductor powder layers.

Due to the good conductivity of the embedded one or more first wires or threads, this allows for current feeding (in the case of the solar cells a current diversion) without significant potential losses, which is of advantage for both applications. Especially in an application in light emitting components this allows for assuring a very even voltage supply, which, especially in applications for widespread light generation, assure very homogenous and thus advantageous uniformity.

In one embodiment of the invention, for example for serially connecting at least two optoelectronic components, at least a second wire or thread is provided that is suitably applied to an appropriate surface of the layer or membrane, respectively, so as to pattern rear contacts or front contacts, respectively, for serially connecting optoelectronic components. If material on the surface subsequently is deposited with the second wire for the production of electrical contacts, any second wire functions as a mask enabling patterning. In one embodiment, a second wire causes two adjacent optoelectronic components not to become directly electrically connected to each other through for example rear contacts, and in this respect are electrically separated from each other and will remain so.

In another embodiment, one or more second wires or threads are used for the application of rear contacts in such a way that they are electrically separated at the one or more first wires. Especially in this embodiment, electrode material, and especially transparent electrode material is deposited on the front side of the active layers without the provision of any second wires, so that electrode material which has been deposited will electrically interconnect all active layers to the one or more first wire.

Preferably, the at least one applied second wire is adjacent to the at least one first wire or thread. Patterning is then done in the most suitable way relative to the first wire or thread. In this way, on the one hand, the active, i.e. optoelectronic material may be used in a subsequent component in a most suitable way. On the other hand, the first wire is for exactly adjusting the position of the second wire in relation to the first wire, what clearly simplifies the method.

If the second wire or thread has been applied to the surface of the layer or membrane, respectively, material for any rear contact or front contact will subsequently be applied. Following this, in one embodiment, the second wire or thread will be removed, and will at least be removed if the second wire or thread is electrically conductive. In this way, the desired patterning is produced.

In one embodiment of the invention, a second wire or thread is applied adjacent to each respective sides of a first wire. Subsequently, material is applied for a contact, preferably for a rear contact. The two second wires cause the applied contacts, especially rear contacts, to be electrically separated from the first wire in the final product.

Advantageously, the second wire or thread is electrically non-conductive. Advantageously, a production step may then be avoided, and it is the step of removing the second wire which is avoided following application of the material for rear contacts or front contacts, since the second wire electrically separates electrically conductive regions from each other.

In order to particularly prevent material of the rear contact or front contact to be able to enter between the surface of the layer or membrane, respectively, and the second wire during application, in one embodiment, the second wire is pressurized against the surface of the membrane. Preferably, that pressure is generated by providing the membrane in a convexly bent manner and by extending the wire across the curve in the tight state, i.e. the procedure is performed as it is known from patent document WO 2007/085343 A1.

The second wire or thread, which for example may consist of metal or polymer, preferably has a lower thermal expansion coefficient and/or expansion coefficient. Preferably, the thermal expansion coefficient and/or expansion coefficient is lower than the expansion coefficient or elongation coefficient of the first wire. In this way it is enabled to maintain the position of the second wire on the surface of the layer in an improved manner.

Basically, the thickness of the contacts is lower than the diameter of the second wire. Preferably, the diameter of the second wire or thread is at least twice as thick as the thickness of a front or rear contact, to reliably separate the front and rear contacts, respectively.

The distance between the second and first wire is preferably smaller than 1 mm, in order to achieve good efficiencies.

If the optoelectronic or the optoelectronic active regions, respectively, have been serially interconnected to each other, the system generally is encapsulated in the known manner to protect the components from external influences, such as humidity. In particular, solar cells are produced in this way which are serially interconnected to each other.

FIG. 1 shows a sectional view of a layer 1, which preferably consists of a polymer material which is not fully cured. First wires 2 preferably consisting of metal are pushed into the layer 1 in regular intervals, and are pushed into it, such that the first wires 2 finally protrude from both surfaces of the layer 1.

Figure 2:
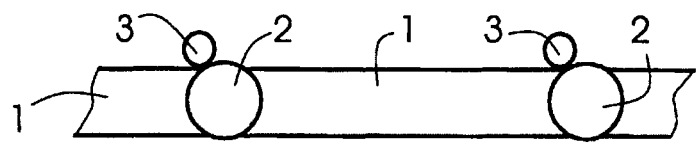

Following this first production step, as it is shown in FIG. 2, second wires 3 are applied to the surface of the layer 1, and are each applied adjacent to the first wires 2. Advantageously, the diameters of the second wires 3 are very small, and are especially even smaller than the diameter of the wires 1, so as to be able to utilized optoelectronic material in the best possible manner.

Figure 3:
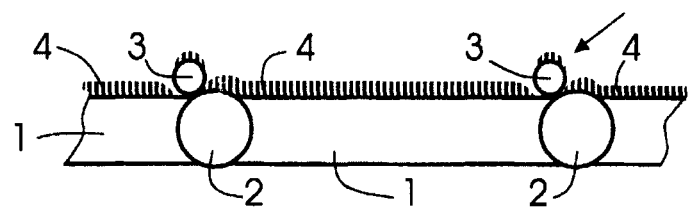

Following application of the second wires 3 electrode material such as for example ITO will be deposited onto the surface, as it is shown in FIG. 3. Deposition may be performed perpendicular to the surface. Whereas in one embodiment, deposition is advantageously performed in an angle smaller than 90 degrees, as it is shown in FIG. 3 by the arrow from the left side above to the right side below, when the second wire is located on the left side of the first wire (or vice versa), and in particular is performed in this way when the second wire or thread 3 consists of an electrically non-conductive material. This direction of deposition assists removal of a second wire or thread 3 which is not required after the deposition, to electrically separate the electrical contacts from each other in a suitable manner.

Figure 4:
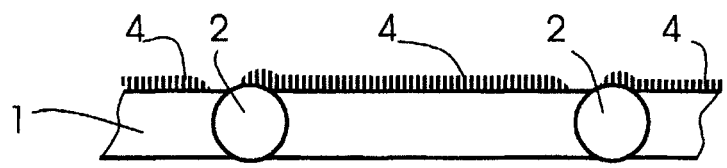

In FIG. 4 the case is depicted, where the second wires or threads 3 have been removed. Following this, the other side may be provided with contacts in the same manner, so that finally the object shown in FIG. 5 will be present. It comprises three optoelectronic components each having an optoelectronic active layer 1a, 1b, 1c, each having one electrically conductive front contact 4, one electrical conductive rear contact 5, electrically contacting or not contacting, respectively, the first wires 2, so that the three optoelectronic components are electrically connected in series to each other through the active regions 1a, 1b and 1c.

Figure 5:
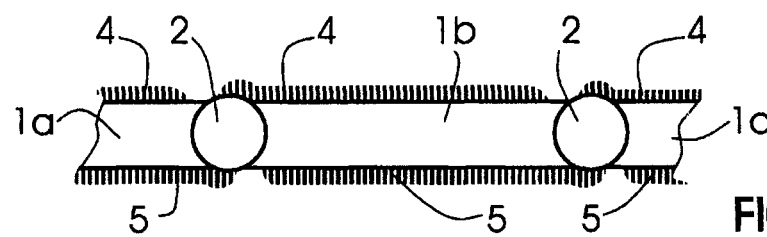

In the FIG. 5 a system of optoelectronic components each comprising one optoelectronic active region 1a, 1b, 1c is represented. First wires or threads 2 divide optoelectronic active regions 1a, 1b, 1c of the layer 1. The first wires or threads 2 serially connect optoelectronic active regions 1a, 1b, 1c by way of rear contacts 5 and front contacts 4. Especially the front contacts consist of a transparent material to allow light to enter the optoelectronic active regions 1a, 1b, 1c from the outside, or vice versa.

If the material of the layer 1 is not an optoelectronic material, optoelectronic material is added to this layer 1, and is preferably added in the form of particles. The particles are in particular introduced, when the condition shown in FIG. 1 applies and the material of the layer 1 is still flowable, i.e. especially prior to fully curing polymer material. The particle diameters are preferably slightly larger than the thickness of the layer 1, so that they can protrude from both surfaces for contacting, similar to the first wire of the thread 2.

The invention claimed is:

1. A method for producing electrically interconnected optoelectronic components, wherein a layer with at least one first wire or thread located therein, is produced, which is electrically conductive or is made electrically conductive, and a first and second electrooptically active region of the layer is electrically connected to the at least one first wire or thread in such a way that the two electrooptically active regions are electrically interconnected to each other, and wherein the layer is flexible and/or is applied on or below a flexible substrate, and wherein the first wire or thread is pushed into the first layer, when the material of the layer is present as an only partially cured polymer.

2. The method according to claim 1, wherein the first wire or thread is introduced through a surface of the layer in such a way that the first wire or thread partially protrudes from the surface.

3. The method according to claim 1, wherein the layer consists of an electrically non-conductive material, and in the layer particles are introduced that consist of an optoelectronic material.

4. The method of claim 3, wherein the particles are introduced following introduction of the first wire or thread.

5. The method especially according to claim 1, wherein an optoelectronic active layer is provided with at least one electrically conductive region that is present as a first wire or thread or is present in the form of a web separating the two optoelectronic regions of the layer from each other, and wherein, for electrically connecting at least two optoelectronic regions of the layer at least a second wire or thread is provided, which suitably is applied to an appropriate surface of the layer or membrane, respectively, to pattern rear contacts or front contacts, respectively, produced by deposition, for electrically connecting optoelectronic regions.

6. The method according to claim 5, wherein for the at least one second wire or thread an installation is provided, the installation being a region protruding from the surface of the first wire or thread.

7. The method according to claim 6, wherein the at least one second wire or thread is removed following application of electrical conductive material for the production of a rear or front contact.

8. The method according to claim 5, wherein the two electrooptically active regions are serially interconnected to each other.

9. The method especially according to claim 1, wherein a second wire is applied to the first wire protruding from the layer surface, whereupon electrical contact material is applied onto the layer.

10. The method according to claim 1, wherein the two electrooptically active regions are serially interconnected to each other.

11. A system of optoelectronic components, each comprising an optoelectronic active region, producible according to a method according to claim 1, having a first electrically conductive wire or thread, which subdivides the layer into optoelectronic active regions, as well as electrically interconnects them by way of rear contact and front contact in series, and wherein at least a first wire or thread protrudes from active layer regions and is produced in such a way that it is able to deflect light directed towards the wire or thread into active layer regions.

12. The system of claim 11, wherein the first wire or thread has a metallic surface that protrudes from active layer regions and is produced in such a way that the metallic surface is able to deflect light directed towards the wire or thread into active layer regions.

13. A method for producing electrically interconnected optoelectronic components, wherein a layer with at least a first wire or thread located therein, is produced, which is electrically conductive or is made electrically conductive, and a first and second electrooptically active region of the layer is electrically connected to the at least one first wire in such a way that the two electrooptically active regions are electrically interconnected to each other, and wherein an optoelectronic active layer is provided with at least one electrically conductive region that is present as a first wire or thread or is present in the form of a web separating the two optoelectronic regions of the layer from each other, and wherein, for electrically connecting at least two optoelectronic regions of the layer at least a second wire or thread is provided, which suitably is applied to an appropriate surface of the layer or membrane, respectively, to pattern rear contacts or front contacts, respectively, produced by deposition, for electrically connecting optoelectronic regions.

14. The method according to claim 13, wherein for the at least one second wire or thread an installation is provided, the installation being a region protruding from the surface of the first wire or thread.

15. The method according to claim 14, wherein the at least one second wire or thread is removed following application of electrical conductive material for the production of a rear or front contact.

16. The method according to claim 13, wherein the two electrooptically active regions are serially interconnected to each other.

* * * * *